(12) United States Patent
Cho et al.

(10) Patent No.: US 8,684,550 B2
(45) Date of Patent: Apr. 1, 2014

(54) LIGHT SOURCE, LIGHT-EMITTING MODULE HAVING THE SAME AND BACKLIGHT UNIT HAVE THE SAME

(75) Inventors: Joo-Woan Cho, Asan-si (KR); Seong-Sik Choi, Seoul (KR); Se-Ki Park, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 308 days.

(21) Appl. No.: 12/511,431

(22) Filed: Jul. 29, 2009

(65) Prior Publication Data

US 2010/0172124 A1    Jul. 8, 2010

(30) Foreign Application Priority Data

Jan. 7, 2009 (KR) .................. 10-2009-0001055

(51) Int. Cl.
*F21V 29/00* (2006.01)

(52) U.S. Cl.
CPC ...................... *F21V 29/00* (2013.01)
USPC .......... 362/97.3; 362/373; 362/294; 362/580; 362/218

(58) Field of Classification Search
USPC ........ 362/97.3, 580, 97.2, 218; 361/704, 707; 165/185; 257/88
See application file for complete search history.

(56) References Cited

U.S. PATENT DOCUMENTS

| | | | |
|---|---|---|---|
| 6,909,123 B2 * | 6/2005 | Hayashimoto et al. | 257/98 |
| 7,128,454 B2 * | 10/2006 | Kim et al. | 362/507 |
| 7,453,093 B2 * | 11/2008 | Kim et al. | 257/79 |
| 7,625,104 B2 * | 12/2009 | Zhang et al. | 362/294 |
| 8,016,471 B2 * | 9/2011 | Pai | 362/612 |
| 2010/0032705 A1 * | 2/2010 | Shin et al. | 257/99 |
| 2010/0177522 A1 * | 7/2010 | Lee | 362/373 |

FOREIGN PATENT DOCUMENTS

| | | | | |
|---|---|---|---|---|
| JP | 59132639 A | * | 7/1984 | ........... H01L 23/48 |
| JP | 2005-101484 | | 4/2005 | |
| JP | 2008-117886 | | 5/2008 | |
| KR | 1020060031030 A | | 4/2006 | |
| KR | 100703094 B1 | | 3/2007 | |

\* cited by examiner

*Primary Examiner* — Sharon Payne
(74) *Attorney, Agent, or Firm* — F. Chau & Associates, LLC

(57) ABSTRACT

A light source includes a heat-dissipating plate, a heat-dissipating pin protruding from the heat-dissipating plate, a light emitting chip for emitting light, and a housing surrounding the light emitting chip, the housing having a receiving space spanning from a top surface to a bottom surface of the housing, wherein the heat-dissipating plate is disposed on the bottom surface of the housing, wherein the light emitting chip is disposed on the heat-dissipating plate exposed by the receiving space.

14 Claims, 8 Drawing Sheets

LIGHT SOURCE, LIGHT-EMITTING MODULE HAVING THE SAME AND BACKLIGHT UNIT HAVE THE SAME

CROSS REFERENCE TO RELATED APPLICATION

This application claims priority to Korean Patent Application No. 2009-1055, filed on Jan. 7, 2009, the contents of which are herein incorporated by reference in their entirety.

BACKGROUND OF THE INVENTION

1. Technical Field

The present disclosure relates to a light source, a light-emitting module having the light source and a backlight unit (BLU) having the light source, and more particularly, to a light source including a light-emitting diode (LED) mounted on a substrate, a light-emitting module having the light source and a BLU having the light source.

2. Discussion of the Related Art

A liquid crystal display (LCD) apparatus includes a light source unit.

The light source unit may include a cold cathode fluorescent lamp (CCFL) or the LED as a light source. The LED includes a semiconductor layer emitting light based on an electric current. About 20% to about 30% of electrical energy applied to the LED is converted into light energy and the rest of the electrical energy applied to the LED is converted into thermal energy. Heat generated in the thermal energy conversion process may decrease the light-emitting efficiency of the LED.

When LEDs are used in a direct illumination type BLU in which a plurality of the light sources are disposed directly under the display panel, the LEDs are mounted on a printed circuit board (PCB) on which a power line pattern is formed. A power-transmitting substrate transmits driving power to the LED through the PCB.

The LED has low heat resistance. Thus, the heat generated from the LEDs needs to be dissipated to the outside of the LED.

The light-emitting efficiency of each of the LEDs varies according to a heat-dissipating structure of the light source unit. When a 40-inch BLU includes about a hundred LEDs of a top view type, the heat generated from the LEDs may have a harmful effect on the operational efficiency of the BLU and the display quality of a display panel.

SUMMARY OF THE INVENTION

According to an exemplary embodiment of the present invention, a light source comprises a heat-dissipating plate, a heat-dissipating pin protruding from the heat-dissipating plate, a light emitting chip for emitting light, and a housing surrounding the light emitting chip, the housing having a receiving space spanning from a top surface to a bottom surface of the housing, wherein the heat-dissipating plate is disposed on the bottom surface of the housing, wherein the light emitting chip is disposed on the heat-dissipating plate exposed by the receiving space.

The light source may further comprise a power-transmitting part fixed to the housing adjacent to the heat-dissipating plate, and exposed to the outside of the housing, and a plurality of power connecting wires electrically connecting the light-emitting chip with the power-transmitting part.

The heat-dissipating pin may extend from an end portion of the heat-dissipating plate along a first direction.

The power-transmitting part may comprise power input and power output parts fixed to the housing and positioned respectively adjacent to both sides of the heat-dissipating plate along a second direction substantially perpendicular to the first direction, and the power input and output parts extend beyond the housing.

The heat-dissipating pin may extend substantially perpendicular to the heat-dissipating plate, and the power input and power output parts are exposed through the receiving space and extend substantially parallel with the bottom surface of the housing.

The light source may further comprise an insulating adhesive disposed between the light-emitting chip and the heat-dissipating plate.

The light source may further comprise a light-transmitting window covering the receiving space and transmitting light emitted from the light-emitting chip.

According to an exemplary embodiment of the present invention, a light-emitting module comprises a base substrate and a power line, the base substrate having a first surface on which a plurality of light source areas is defined and a second surface facing the first surface, a combination hole being formed through the base substrate from the first surface to the second surface in the light source area, the power line being formed adjacent to the light source area, and a light source including a heat-dissipating plate disposed on the base substrate, a beat-dissipating pin protruding from the heat-dissipating plate and inserted into the combination hole, a light emitting chip electrically connected to the power line, and a housing surrounding the light emitting chip, the housing having a receiving space spanning from a top surface to a bottom surface of the housing, wherein the heat-dissipating plate is disposed on the bottom surface of the housing, wherein the light emitting chip is disposed on the heat-dissipating plate exposed by the receiving space.

The light-emitting module may further comprise a heat-dissipating layer formed in the light source area of the first surface to contact the heat-dissipating plate, the heat-dissipating layer extending to an inner surface of the combination hole to contact the heat-dissipating pin, and extending to the second surface adjacent to the combination hole.

The heat-dissipating pin may extend from an end portion of the heat-dissipating plate along a first direction.

The light-emitting module may further comprise power input and power output parts fixed to the housing and respectively adjacent to both sides of the heat-dissipating plate along a second direction substantially perpendicular to the first direction, and extending beyond the housing and electrically connected with power input and power output lines of the power line, respectively, and a plurality of power connecting wires respectively connecting the power input and power output parts with the light-emitting chip.

The heat-dissipating pin can extend substantially perpendicular to the heat-dissipating plate, and the power input and power output parts may extend substantially parallel with the first surface.

The heat-dissipating pin may protrude beyond the second surface of the base substrate.

According to an exemplary embodiment of the present invention, a backlight unit (BLU) comprises a receiving container including a bottom plate, a base substrate and a power line, the base substrate having a first surface on which a plurality of light source areas is defined, and a second surface facing the first surface and facing the bottom plate, a combination hole being formed through the base substrate from the first surface to the second surface in the light source area, the power line being formed adjacent to the light source area; and a light source includes a heat-dissipating plate disposed on the base substrate, a heat-dissipating pin protruding from the heat-dissipating plate and inserted into the combination hole, a light emitting chip electrically connected to the power line, and a housing surrounding the light emitting chip, the housing having a receiving space spanning from a top surface to a bottom surface of the housing, wherein the heat-dissipating plate is disposed on the bottom surface of the housing, wherein the light emitting chip is disposed on the heat-dissipating plate exposed by the receiving space.

The BLU may further comprise a heat-dissipating layer formed in the light source area of the first surface, contacting the heat-dissipating plate, the heat-dissipating layer extending to an inner surface of the combination hole to contact the beat-dissipating pin, and extending to the second surface adjacent to the combination hole.

The heat-dissipating pin may extend from an end portion of the heat-dissipating plate along a first direction, and the light source further comprises the power-transmitting part including power input and power output parts fixed to the housing and respectively adjacent to both sides of the heat-dissipating plate along a second direction substantially perpendicular to the first direction, the power input part and the power output part extending beyond the housing to be electrically connected with power input and power output lines of the power line, respectively.

The BLU may further comprise a heat-dissipating sheet disposed between the bottom plate and the second surface and contacting the second surface and the heat-dissipating layer.

The heat-dissipating pin may have a length shorter than a thickness of the base substrate.

The heat-dissipating pin may protrude from the second surface and is bent to be substantially parallel with the second surface.

The heat-dissipating pin may include a zigzag pattern.

BRIEF DESCRIPTION OF THE DRAWINGS

Exemplary embodiments of the present invention can be understood in more detail from the following descriptions taken in conjunction with the accompanying drawings, in which.

DETAILED DESCRIPTION OF EXEMPLARY EMBODIMENTS

The present invention is described more fully hereinafter with reference to the accompanying drawings, in which exemplary embodiments of the present invention are shown. The present invention may, however, be embodied in many different forms and should not be construed as limited to the exemplary embodiments set forth herein.

It will be understood that when an element or layer is referred to as being "on," "connected to" or "coupled to" another element or layer, it can be directly on, connected or coupled to the other element or layer or intervening elements or layers may be present.

Figure 1:
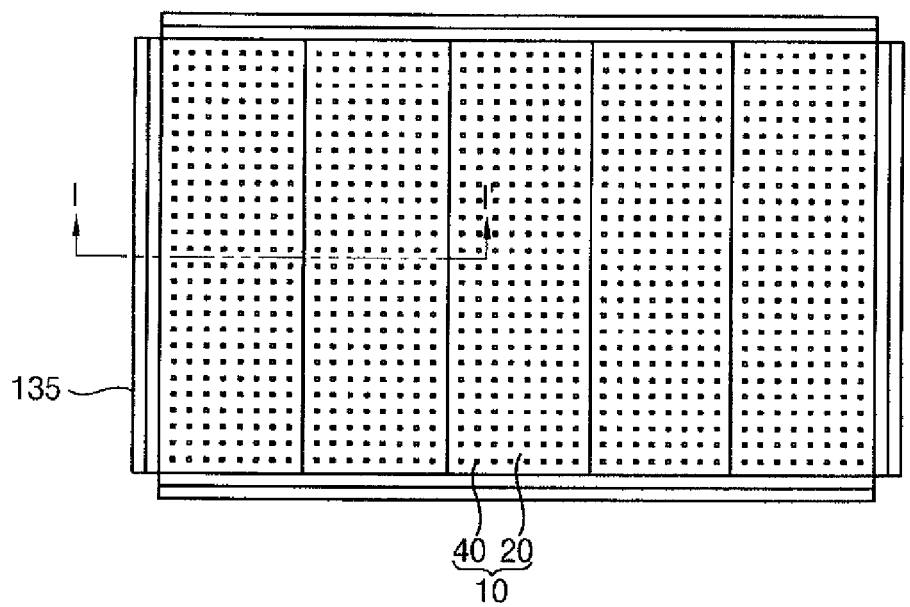
FIG. 1 is a plan view illustrating a BLU according to an exemplary embodiment of the present invention.
Figure 2:
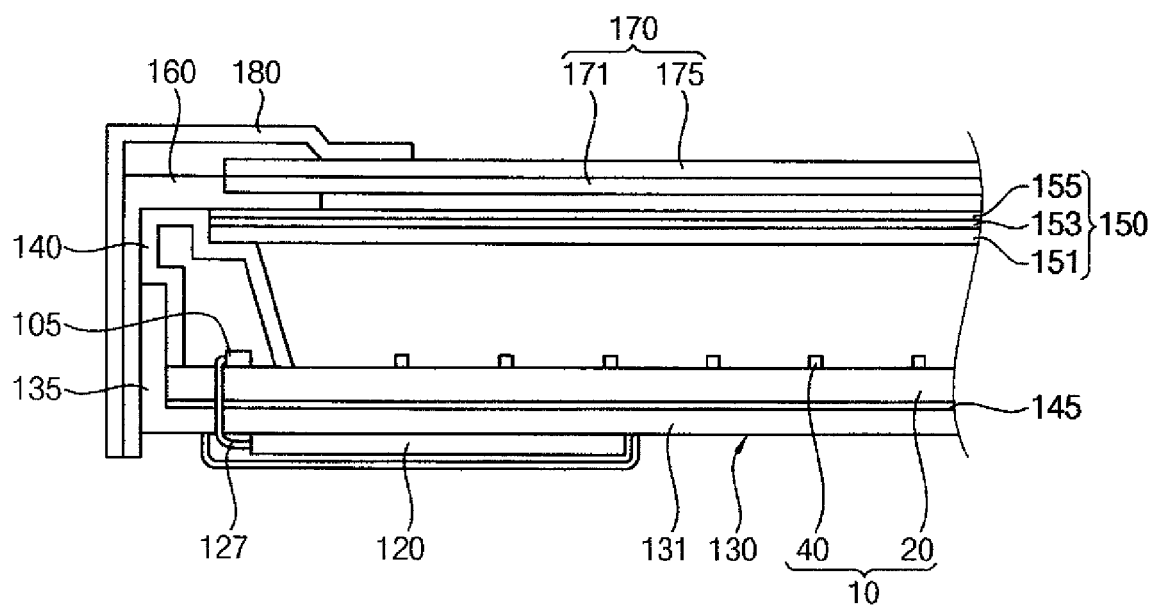
FIG. 2 is a cross-sectional view taken along the line I-I' in FIG. 1 according to an exemplary embodiment of the present invention.

FIG. 1 is a plan view illustrating a backlight unit (BLU) 101 according to an exemplary embodiment of the present invention. FIG. 2 is a cross-sectional view taken along the line I-I' in FIG. 1 according to an exemplary embodiment of the present invention.

Referring to FIGS. 1 and 2, the BLU 101 is disposed under a display panel. The display panel is supported by a middle mold and fixed to the middle mold by a top chassis. The BLU 101 provides light to a rear surface of the display panel displaying an image based on the light. A display apparatus 100 includes the BLU 101 and the display panel. The BLU 101 includes a receiving container 130, a power-transmitting substrate 20 and a light source 40. A light-emitting module 10 includes the power-transmitting substrate 20 and the light source 40.

The receiving container 130 includes a bottom plate 131 on which a plurality of the power-transmitting substrates 20 is disposed, and side walls 135. The side walls 135 extend from edges of the bottom plate 131. The receiving container 130 blocks electromagnetic waves, and has high heat dissipation and high rigidity. The receiving container 130 may comprise, for example, metal.

Figure 3:
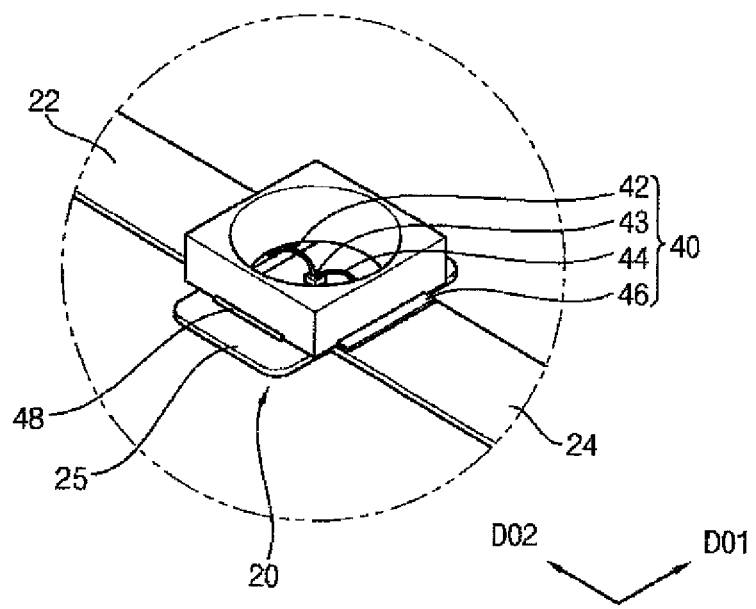
FIG. 3 is a perspective view illustrating a light-emitting module according to an exemplary embodiment of the present invention.
Figure 4:
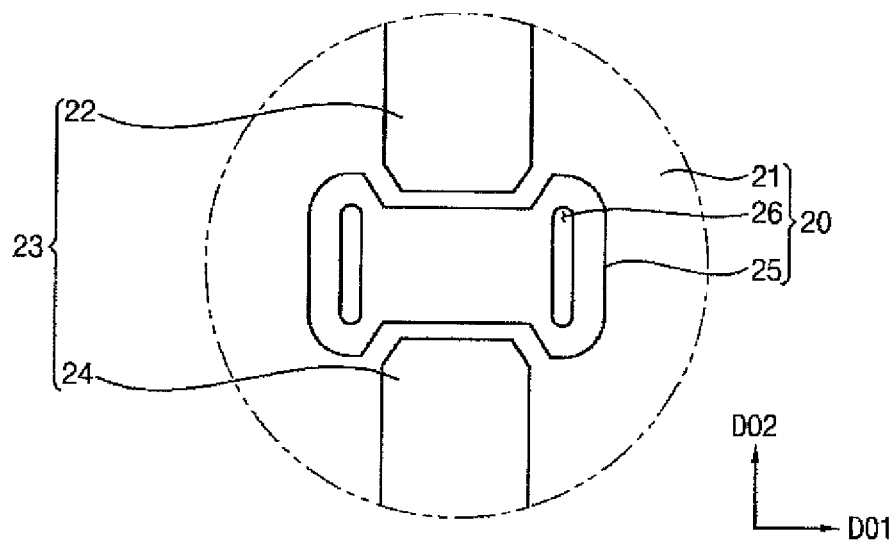
FIG. 4 is a plan view illustrating a power-transmitting substrate according to an exemplary embodiment of the present invention.

FIG. 3 is a perspective view illustrating the light-emitting module 10 according to an exemplary embodiment of the present invention. FIG. 4 is a plan view illustrating the power-transmitting substrate 20 according to an exemplary embodiment of the present invention.

Referring to FIGS. 3 and 4, the power-transmitting substrate 20 includes a base substrate 21 and a power line 23. The power-transmitting substrate 20 may be a printed circuit board (PCB) such as, for example, FR4 or a metal-core printed circuit board (MCPCB).

The base substrate 21 has electrical insulating characteristics, and includes a first surface and a second surface facing the first surface. A plurality of light source areas are defined on the first surface. The light source 40 is disposed on a light source area. The light source 40 includes power connecting wires 42, 44 for electrically connecting the light emitting chip 43 with the power input part 45 and the power output part 46. The light source areas are arranged in matrix. A combination hole 26 is formed through the base substrate 21 from the first surface to the second surface in the light source area.

The power line 23 is formed on the base substrate 21 and adjacent to the light source area, and includes a power input line 22 and a power output line 24. The power line 23 may be covered by an insulation layer in an exemplary embodiment of the present invention.

Figure 5:
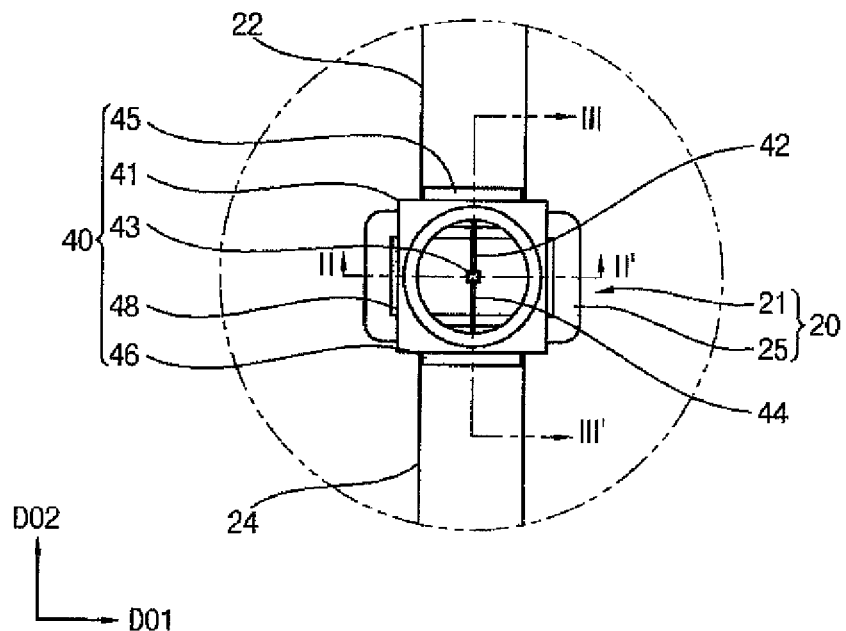
FIG. 5 is a plan view illustrating a light-emitting module according to an exemplary embodiment of the present invention.
Figure 6:
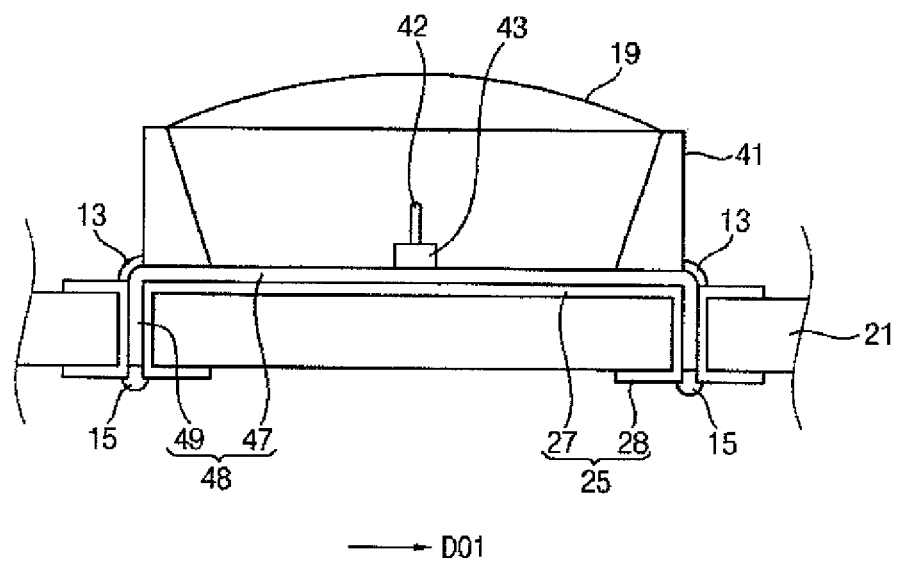
FIG. 6 is a cross-sectional view taken along the line II-II' in FIG. 5 according to an exemplary embodiment of the present invention.

FIG. 5 is a plan view illustrating the light-emitting module 10 according to an exemplary embodiment of the present invention. FIG. 6 is a cross-sectional view taken along the line II-II' in FIG. 5 according to an exemplary embodiment of the present invention.

Referring to FIGS. 5 and 6, a shape and a number of the combination holes 26 may be changed according to a shape of the light source 40. In an exemplary embodiment, the combination hole 26 has a line shape. For example, two combination holes 26 can be symmetrically formed with each other in one light source area.

In an exemplary embodiment, the power-transmitting substrate 20 further includes a heat-dissipating layer 25. For example, the heat-dissipating layer 25 may include a first portion 27 and a second portion 28. The first portion 27 is formed in light source area of the first surface and the second portion 28 is formed on the second surface adjacent to the combination hole 26. The first portion 27 is connected to the second portion 28 through a connecting portion formed in the combination hole 26. The heat-dissipating layer 25 may include metal having high heat-dissipating proprieties or a nonmetallic material. For example, the heat-dissipating layer 25 may be formed on the base substrate 21 through patterning processes substantially the same as processes for forming the power line 23.

For example, driving elements 105 may be mounted on a side of the power-transmitting substrate 20, as illustrated, for example, in FIG. 2. The driving elements 105 convert external electrical power into driving power for the light source 40. The display apparatus 100 may include a light source driving part 120. The light source driving part 120 may be disposed on a rear surface of the bottom plate 131, and may be electrically connected with the driving elements 105 through wires 127. For example, the light source driving part 120 may control the driving elements 105 according to light source control signals transmitted by a panel driving part driving the display panel.

Figure 7:
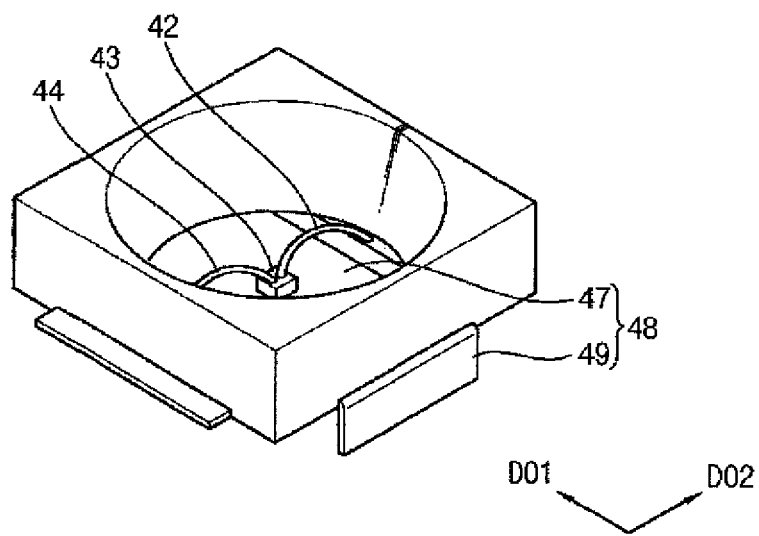
FIG. 7 is a perspective view illustrating a front surface of a light source according to an exemplary embodiment of the present invention.
Figure 8:
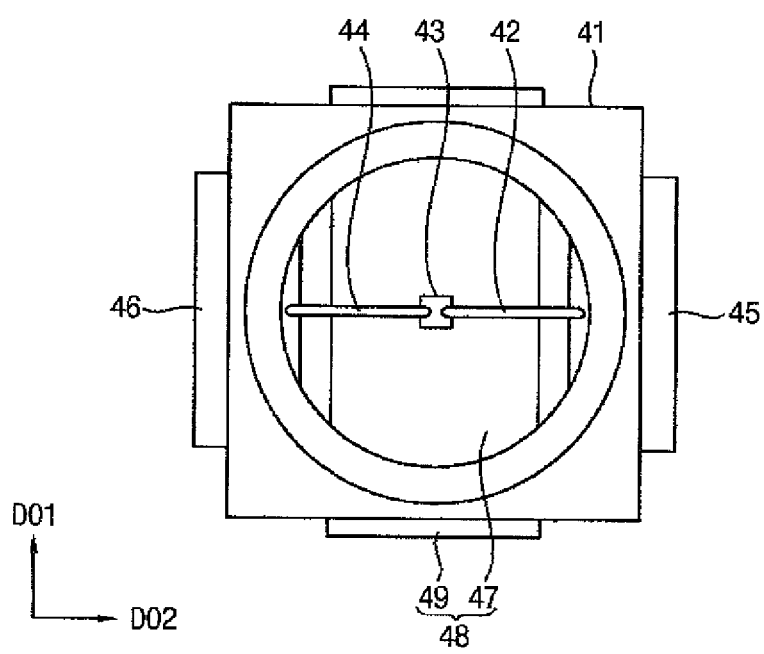
FIG. 8 is a plan view illustrating a front surface of a light source according to an exemplary embodiment of the present invention.
Figure 9:
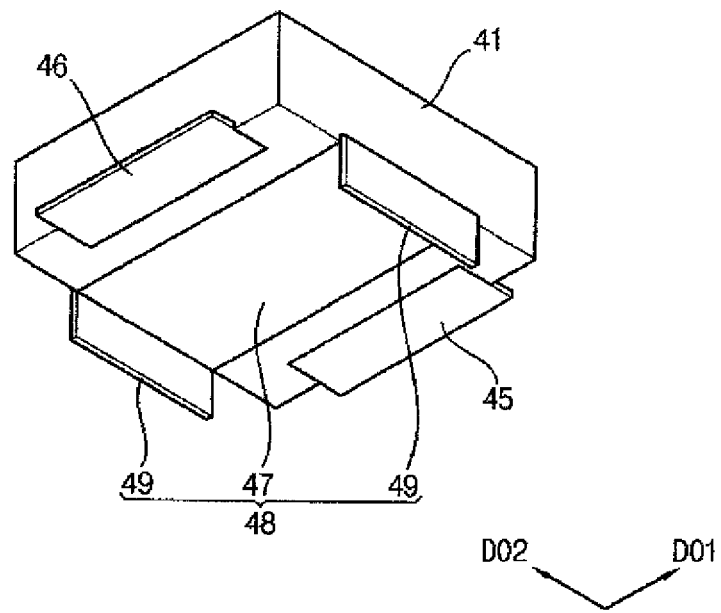
FIG. 9 is a perspective view illustrating a rear surface of a light source according to an exemplary embodiment of the present invention.
Figure 10:
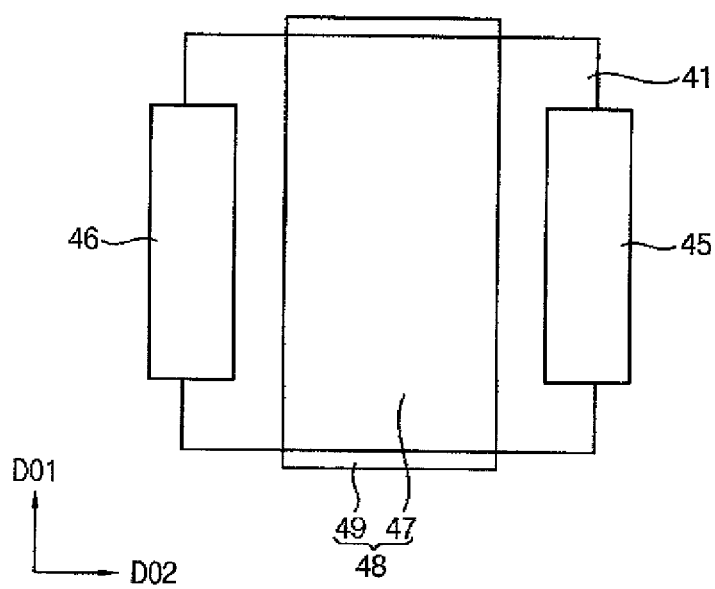
FIG. 10 is a plan view illustrating a rear surface of a light source according to an exemplary embodiment of the present invention.

FIG. 7 is a perspective view illustrating a front surface of the light source 40 according to an exemplary embodiment of the present invention. FIG. 8 is a plan view illustrating a front surface of the light source 40 according to an exemplary embodiment of the present invention. FIG. 9 is a perspective view illustrating a rear surface of the light source 40 according to an exemplary embodiment of the present invention. FIG. 10 is a plan view illustrating a rear surface of the light source 40 according to an exemplary embodiment of the present invention.

Referring to FIGS. 3, 7, 8, 9 and 10, the light source 40 is mounted in the light source area. The driving power is applied to the light source 40, and then the light source 40 emits light. Heat may be generated from the light source 40 when a plurality of the light sources 40 emit the light. The light source 40 according to an exemplary embodiment includes a housing 41, a heat-dissipating part 48 and a light-emitting chip 43. In an exemplary embodiment of the present invention, high heat-dissipating efficiency can be achieved due to a heat-dissipating structure including the heat-dissipating part 48.

The housing 41 is a body of the light source 40 and may include a plastic molding product. The housing 41 can have, for example, a substantially hexahedron shape. The housing 41 includes a receiving space formed therein. The receiving space can be formed by forming a through hole from a top surface of the housing 41 to a bottom surface of the housing 41. In an exemplary embodiment the removed top surface can be larger than the removed bottom surface as shown, for example, in FIG. 8. A bottom portion of the housing 41 is partially open to the receiving space. For example, a first opening portion extending along a first direction D01 may be formed through the bottom of the housing 41, and second opening portions may be formed through edges of the bottom of the housing 41 in a second direction D02 substantially perpendicular to the first direction D01. The housing 41 may have a size of about 1 to about 10 millimeters.

The heat-dissipating plate 48 is disposed on the bottom surface of the housing 41. The heat-dissipating part 48 includes a heat-dissipating plate 47 and a plurality of heat-dissipating pins 49. The heat-dissipating plate 47 is supported by the bottom surface of the housing 41. Thus, the heat-dissipating plate 47 is exposed to the receiving space of the housing 41 as illustrated, for example, in FIGS. 7 and 8. The heat-dissipating plate 47 is disposed on a rear face of the housing 41 as illustrated, for example, in FIGS. 9 and 10. The heat-dissipating pins 49 protrude downward from the heat-dissipating plate 47. For example, the heat-dissipating pins 49 may extend from end portions of the heat-dissipating plate 47 in a direction, so that the heat-dissipating pins 49 extend substantially perpendicular to the heat-dissipating plate 47. Thus, the heat-dissipating part 48 may include two heat-dissipating pins 49 according to an exemplary embodiment of the present invention.

The light source 40 further includes a power-transmitting part. The power-transmitting part can be fixed to the housing 41 adjacent to the beat-dissipating part 48, and electrically connects the power line 23 with the light-emitting chip 43. The power-transmitting part includes a power input part 45 and a power output part 46. The power input and power output parts 45 and 46 are fixed to the housing 41 and are respectively adjacent to both sides of the heat-dissipating part 48 in the second direction D02. The power input and power output parts 45 and 46 are drawn out through the second opening portions, and extend substantially parallel with the rear surface of the bottom of the housing 41. The power input and power output parts 45 and 46 are disposed substantially parallel with the first surface of the base substrate 21, and are electrically connected with the power input and power output lines 22 and 24 formed on the base substrate 21, respectively. For example, the power input and power output parts 45 and 46 may be connected with the power input and power output lines 22 and 24 via soldering.

The light source 40 includes a light-transmitting window 19. The light-transmitting window 19 covers the receiving space, physically and chemically protects the light-emitting chip 43, and transmits the light emitted from the light-emitting chip 43.

Figure 11:
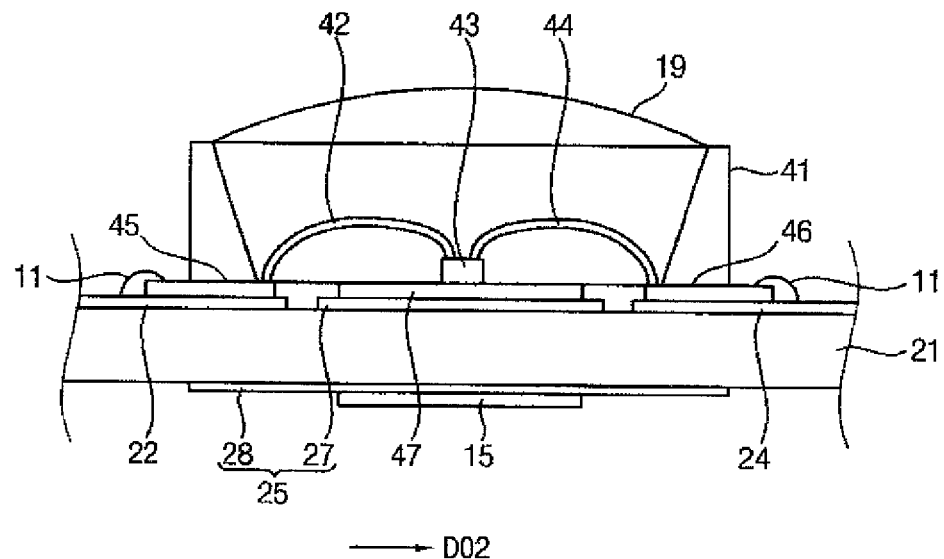
FIG. 11 is a cross-sectional view taken along the line III-III' in FIG. 5 according to an exemplary embodiment of the present invention.

FIG. 11 is a cross-sectional view taken along the line III-III' in FIG. 5 according to an exemplary embodiment of the present invention.

Referring to FIGS. 6, 9 and 11, each of the heat-dissipating pins 49 is inserted into each of the combination holes 26. The heat-dissipating plate 47 contacts the heat-dissipating layer 25 formed on the first surface of the base substrate 21. The heat-dissipating pin 49 contacts the heat-dissipating layer 25 formed on the inner surface of the combination hole 26. Thus, the heat generated from the light-emitting chip 43 is dissipated to the outside via a combination structure of the heat-dissipating plate 47 and the heat-dissipating layer 25, and the combination structure of the heat-dissipating plate 47 and the heat-dissipating pin 49.

In an exemplary embodiment the heat-dissipating pin 49 has a width substantially the same as the width of the edge of the heat-dissipating plate 47, and has a length shorter than the length of the combination hole 26 along a direction substantially perpendicular to the base substrate 21. Thus, the heat-dissipating pin 49 may be prevented from being protruded from the second surface of the base substrate 21.

For example, first solder 13 may be formed to connect the edges of the heat-dissipating plate 47 along the first direction D01 with the heat-dissipating layer 25 on the first surface of the base substrate 21. In an exemplary embodiment, second solder 15 may be formed to connect an end portion of the heat-dissipating pin 49 with the heat-dissipating layer 25 which is formed on the inner surface of the combination hole 26 and on the second surface of the base substrate 21 as illustrated, for example, in FIG. 6. As such, the heat-dissipating part 48 may be tightly attached to the heat-dissipating layer 25.

Figure 12:
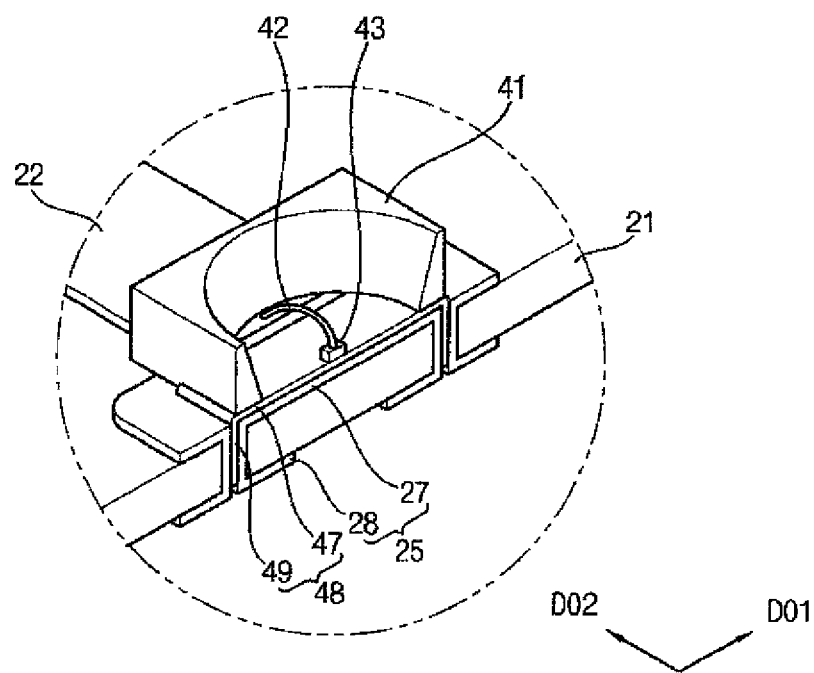
FIG. 12 is a perspective view illustrating a cross-section of a light-emitting module according to an exemplary embodiment of the present invention.

FIG. 12 is a perspective view illustrating a cross-section of the light-emitting module according to an exemplary embodiment of the present invention.

Referring to FIGS. 5 and 12, the light-emitting chip 43 is disposed on the heat-dissipating plate 47 exposed through the receiving space. The power input and power output parts 45 and 46 are respectively disposed on the both sides of the heat-dissipating plate 47, and spaced apart from the heat-dissipating plate 47. The light source 40 further includes first and second wires. The first wire connects the power input part 45 with the light-emitting chip 43. The second wire connects the power output part 46 with the light-emitting chip 43. The light-emitting chip 43 may include, for example, an LED including a semiconductor element emitting the light when the driving power is applied to the semiconductor element.

The light source 40 may further include an insulating adhesive disposed between the light-emitting chip 43 and the heat-dissipating plate 47. The insulating adhesive may include, for example, a silver paste or an epoxy paste having high heat-dissipating properties.

The heat-dissipating part 48, the heat-dissipating layer 25 and the combination hole 26 may form diverse structures according to exemplary embodiments of the present invention, so that the light source 40 and the light-emitting module 10 have the high heat-dissipating efficiency. Therefore, in an exemplary embodiment, the heat generated from the light-emitting chip 43 is dissipated to the base substrate 21 and the bottom plate 131 of the receiving container 130 via the insulating adhesive and the heat-dissipating plate 47 and via the heat-dissipating pin 49 and the heat-dissipating layer 25. As a result, the heat can be dissipated to the outside.

Figure 13:
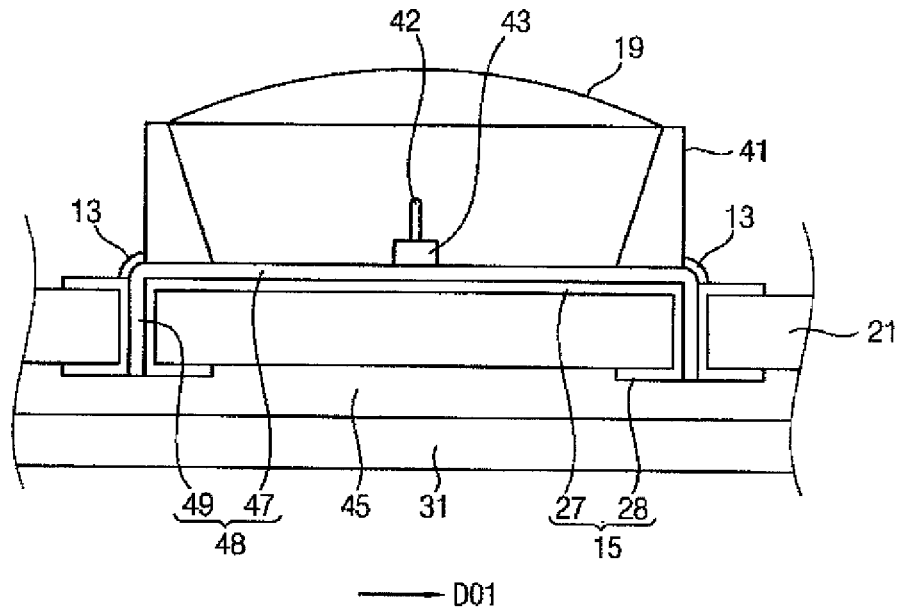
FIG. 13 is a cross-sectional view illustrating a light-emitting module received by a receiving container according to an exemplary embodiment of the present invention.

FIG. 13 is a cross-sectional view illustrating the light-emitting module 10 contained in the receiving container 130 according to an exemplary embodiment of the present invention.

Referring to FIGS. 1, 2 and 13, the BLU 101 includes a side frame 140 and an optical part 150. The side frame 140 is disposed adjacent to the side wall 135 of the receiving container 130, to cover a side of the power-transmitting substrate 20 on which the driving elements 105 are formed.

The optical part 150 is disposed over the light sources 40, and may be supported by an upper surface of the side frame 140 and upper end portions of the side walls 135 of the receiving container 130. The optical part 150 includes a diffusion plate 151, a diffusion sheet 153 and a condensing sheet 155. The BLU 101 may include a middle flume 160 that is combined with the receiving container 130 by pressing an edge of the optical part 150.

Referring to FIGS. 2 and 13, the BLU 101 includes a heat-dissipating sheet 45a. For example, the heat-dissipating sheet 45a may include the nonmetallic material having electrically insulating properties and the high heat-dissipating efficiency. The heat-dissipating sheet 45a is disposed between the bottom plate 131 of the receiving container 130 and the second surface of the base substrate 21. The heat-dissipating layer 25 and the second solder 15 formed on the second surface contact the heat-dissipating sheet 45a. Thus, the heat-dissipating efficiency of the BLU 101 may be increased. Alternatively, when the heat-dissipating sheet 45a is removed from the BLU 101, the heat-dissipating layer 25 and the second solder 15 formed on the second surface directly contact the bottom plate 131, so that the heat-dissipating efficiency of the BLU 101 may be increased.

Figure 14:
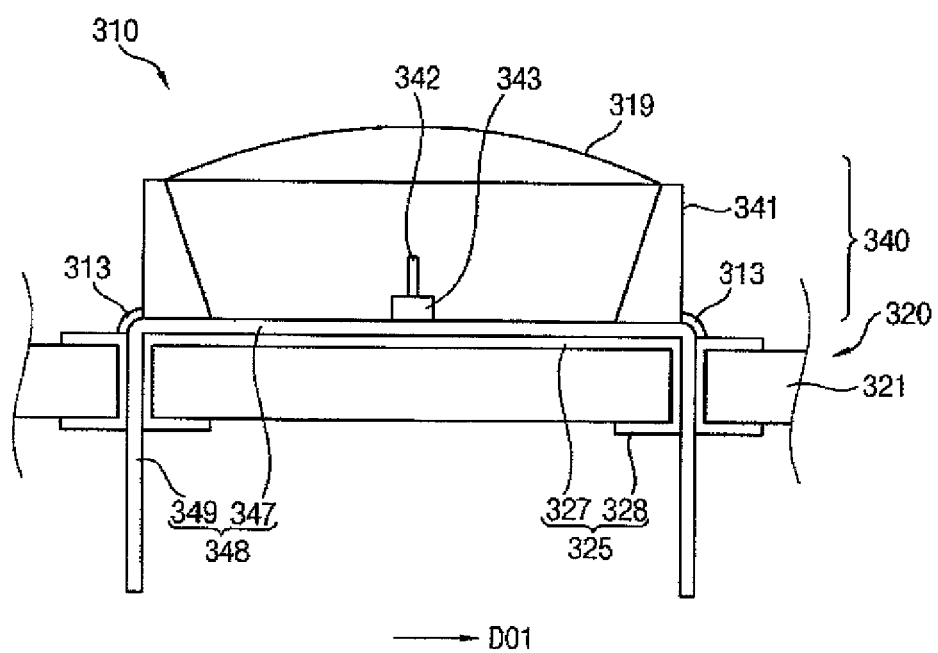
FIG. 14 is a cross-sectional view illustrating a light-emitting module according to an exemplary embodiment of the present invention.

FIG. 14 is a cross-sectional view illustrating a light-emitting module 310 according to an exemplary embodiment of the present invention. The FIG. 15 is a cross-sectional view illustrating a BLU including the light-emitting module 310 according to an exemplary embodiment of the present invention.

Referring to FIG. 14, a light source 340 and a light-emitting module 310 according to an exemplary embodiment is substantially the same as the light source 40 and the light-emitting module 10 described in connection with FIGS. 1 to 13, except that a heat-dissipating pin 349 has a length longer than that of the heat-dissipating pin 49 illustrated in FIGS. 1 to 13. As such, the heat-dissipating pin 349 passes through the combination hole of the base substrate 321 and protrudes from the second surface of the base substrate 321.

Referring to FIG. 14, the heat-dissipating pin 349 protrudes from the second surface of the base substrate 321. The heat-dissipating pin 349 has a straight shape protruding beyond the second surface of the substrate 321. Thus, a contact area between the heat-dissipating part 348 and the heat-dissipating layer 325 may be increased, so that the heat-dissipating efficiency may be increased as compared to an exemplary embodiment illustrated in connection with FIGS. 1 to 13.

Figure 15:
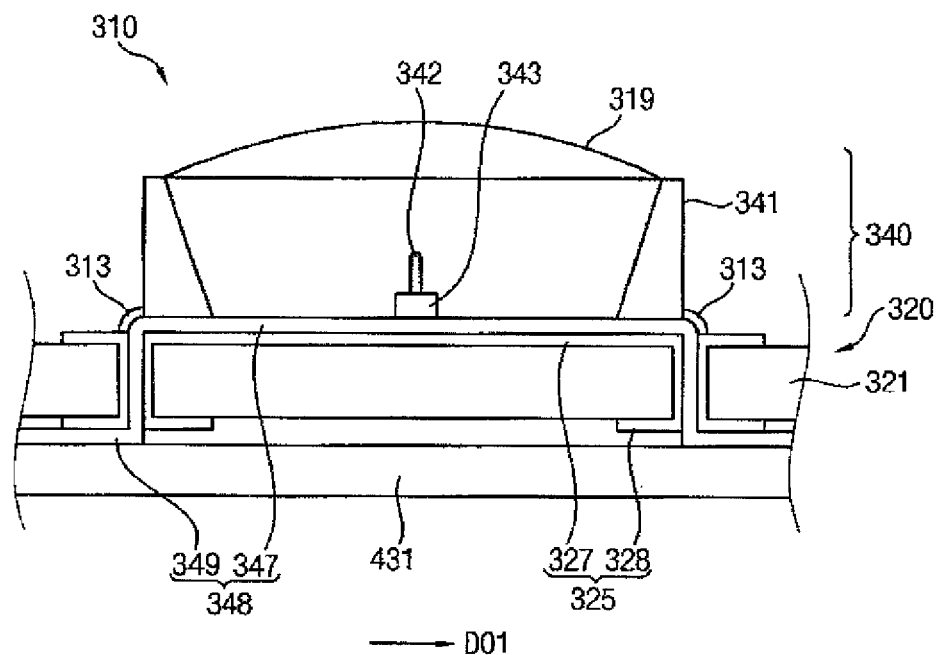
FIG. 15 is a cross-sectional view illustrating a BLU including a light-emitting module according to an exemplary embodiment of the present invention.

Referring to FIG. 15, the heat-dissipating sheet 45a formed in an embodiment described in connection with FIG. 13 is removed from the light emitting module 310. In an exemplary embodiment since the heat-dissipating sheet 45a is removed, a heat-dissipating pin 349 substantially parallel with the second surface contacts the bottom plate 431 of the receiving container 130 comprising metal, so that the heat-dissipating efficiency may be increased. Referring to FIG. 15, the heat-dissipating pin 349 is bent to extend along the second surface of the base substrate 321, so that the heat-dissipating pin 349 contacts the heat-dissipating layer 325 on the second surface.

Figure 16:
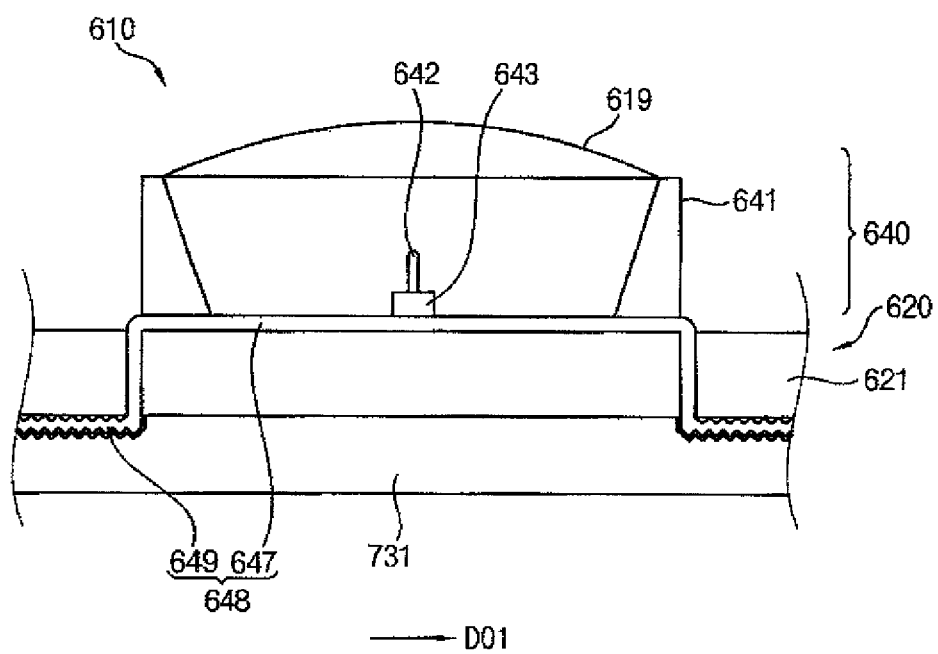
FIG. 16 is a cross-sectional view illustrating a light-emitting module according to an exemplary embodiment of the present invention.

FIG. 16 is a cross-sectional view illustrating a light-emitting module 610 according to an exemplary embodiment of the present invention.

Referring to FIG. 16, a light source 640, a light-emitting module 610 and a BLU according to an exemplary embodiment is substantially the same as the light source 40, the light-emitting module 10 and the BLU 101 according to the embodiment illustrated in connection with FIGS. 1 to 13, except that the heat-dissipating layer 25 is removed from a base substrate 621, a heat-dissipating pin 649 protrudes from a second surface of the base substrate 621 and is bent, the heat-dissipating pin 649 includes a zigzag pattern. The heat-dissipating sheet 45a is removed.

In an exemplary embodiment the heat-dissipating layer is removed from the base substrate 621, so that the number of manufacturing steps for the power-transmitting substrate 620 may be decreased.

The heat-dissipating pin 649 is protruded from the second surface of the base substrate 621 and is bent substantially parallel to the second surface. The heat-dissipating pin 649 directly contacts a bottom plate 731 of a receiving container. The bottom plate 731 includes the zigzag pattern corresponding to the zigzag pattern formed on the heat-dissipating pin 649, so that the contact area may be increased. Therefore, the heat-dissipating efficiency may be increased. In an exemplary embodiment, a manufacturing process can be simplified because the heat dissipating layer 25 and the heat dissipating sheet 45a are omitted.

According to an exemplary embodiment of the present invention, the heat-dissipating efficiency of a light-emitting source including an LED may be substantially increased, so that the light-emitting efficiency may be substantially increased. Thus, exemplary embodiments of the present invention may be applied to an edge illumination type BLU and a direct illumination type BLU including the LED, or may be applied to any illumination apparatus.

According to an exemplary embodiment of the present invention, large amounts of heat generated from the light-emitting chip may be quickly dissipated to the outside of the light-emitting module, so that the heat-dissipating and light-emitting efficiencies of the light-emitting chip are increased. Thus, the heat-dissipating and light-emitting efficiencies of the BLU may be increased, so that the display quality of a display apparatus can be improved.

Although exemplary embodiments of the present invention have been described herein with reference to the accompanying drawings, it is to be understood that the present invention should not be limited thereto and that various other changes and modifications may be affected therein by one of ordinary skill in the related art without departing from the scope or spirit of the invention. All such changes and modifications are intended to be included within the scope of the invention.

What is claimed is:

1. A light source comprising:
   a heat-dissipating plate disposed on a base substrate;
      a heat-dissipating pin protruding from and continuously extending from the heat-dissipating plate, wherein a first end of the heat-dissipating pin opposite a leading end of the heat-dissipating pin continuously extends from the heat-dissipating plate, wherein the heat-dissipating pin extending from the heat dissipating plate forms a substantial L-shape, wherein the heat-dissipating plate on the base substrate is a first leg of the substantial L-shape, and the heat dissipating pin is a second leg of the substantial L-shape, the second leg of the substantial L-shape extending into a hole formed in the base substrate;
   a heat-dissipating layer including a first portion disposed between the base substrate and the heat-dissipating plate forming the first leg, a second portion disposed on a bottom exterior surface of the base substrate, and a connecting portion extending into the hole in the base substrate, wherein the connecting portion connects the first portion to the second portion and is disposed on a sidewall of the base substrate and in contact with the heat-dissipating pin forming the second leg;
   a light emitting chip for emitting light;
   a housing surrounding the light emitting chip, the housing having a receiving space spanning from a top surface to a bottom surface of the housing, wherein the heat-dissipating plate is disposed on the bottom surface of the housing, wherein the light emitting chip is disposed on the heat-dissipating plate exposed by the receiving space, and the light emitting chip makes contact to the heat-dissipating plate;
   a first solder disposed on a corner edge of the heat-dissipating plate and on the first portion of the heat-dissipating layer to connect the corner edge of the heat-dissipating plate to the first portion of the heat-dissipating layer; and
   a second solder connecting an end portion of the heat-dissipating pin to the connecting portion of the heat-dissipating layer in the hole of the base substrate and the second portion of the heat-dissipating layer.

2. The light source of claim 1, further comprising:
   a power-transmitting part fixed to the housing adjacent to the heat-dissipating plate, and exposed to the outside of the housing; and
   a plurality of power connecting wires electrically connecting the light-emitting chip with the power-transmitting part.

3. The light source of claim 2, wherein the power-transmitting part comprises power input and power output parts fixed to the housing and positioned respectively adjacent to both sides of the heat-dissipating plate along a second direction substantially perpendicular to the first direction, and the power input and output parts extend beyond the housing.

4. The light source of claim 3, wherein the heat-dissipating pin extends substantially perpendicular to the heat-dissipating plate, and the power input and power output parts are exposed through the receiving space and extend substantially parallel with the bottom surface of the housing.

5. The light source of claim 1, further comprising an insulating adhesive disposed between the light-emitting chip and the heat-dissipating plate.

6. The light source of claim 1, further comprising a light-transmitting window covering the receiving space and transmitting light emitted from the light-emitting chip.

7. A light-emitting module comprising:
   a base substrate and a power line, the base substrate having a first surface on which a plurality of light source areas is defined and a second surface facing the first surface, a combination hole being formed through the base substrate from the first surface to the second surface in the light source area, the power line being formed adjacent to the light source area, wherein the first surface is located on an exterior top surface of the base substrate and the second surface is located on an exterior bottom surface of the base substrate; and
   a light source including:
   a heat-dissipating plate disposed on the base substrate;
      a heat-dissipating pin protruding from and continuously extending from the heat-dissipating plate and inserted into the combination hole, wherein a first end of the heat-dissipating pin opposite a leading end of the heat-dissipating pin continuously extends from the heat-dissipating plate, wherein the heat-dissipating pin extending from the heat dissipating plate forms a substantial L-shape, wherein the heat-dissipating plate on the base substrate is a first leg of the substantial L-shape, and the heat dissipating pin is a second leg of the substantial L-shape, the second leg of the substantial L-shape extending into the combination hole formed through the base substrate;

a heat-dissipating layer including a first portion disposed between the base substrate and the heat-dissipating plate forming the first leg, a second portion disposed on the exterior bottom surface of the base substrate adjacent to the combination hole, and a connecting portion extending into an inner surface of the combination hole in the base substrate, wherein the first portion contacts an exterior bottom surface of the heat-dissipating plate forming the first leg and wherein the connecting portion connects the first portion to the second portion and is disposed on a sidewall of the base substrate and in contact with the heat-dissipating pin forming the second leg;

a light emitting chip electrically connected to the power line;

a housing surrounding the light emitting chip, the housing having a receiving space spanning from a top surface to a bottom surface of the housing, wherein the heat-dissipating plate is disposed on the bottom surface of the housing, wherein the light emitting chip is disposed on the heat-dissipating plate exposed by the receiving space, and the light emitting chip makes contact to the heat-dissipating plate;

a first solder disposed on a corner edge of the heat-dissipating plate and on the first portion of the heat-dissipating layer to connect the corner edge of the heat-dissipating plate to the first portion of the heat-dissipating layer; and a second solder connecting an end portion of the heat-dissipating pin to the connecting portion of the heat-dissipating layer in the hole of the base substrate and the second portion of the heat-dissipating layer.

8. The light-emitting module of claim 7, further comprising:

power input and power output parts fixed to the housing and respectively adjacent to both sides of the heat-dissipating plate along a second direction substantially perpendicular to the first direction, and extending beyond the housing and electrically connected with power input and power output lines of the power line, respectively; and a plurality of power connecting wires respectively connecting the power input and power output parts with the light-emitting chip.

9. The light-emitting module of claim 8, wherein the heat-dissipating pin extends substantially perpendicular to the heat-dissipating plate, and the power input and power output parts extend substantially parallel with the first surface.

10. The light-emitting module of claim 7, wherein the heat-dissipating pin protrudes beyond the second surface of the base substrate.

11. A backlight unit (BLU) comprising:

a receiving container including a bottom plate;

a base substrate and a power line, the base substrate having a first surface on which a plurality of light source areas is defined, and a second surface facing the first surface and facing the bottom plate, a combination hole being formed through the base substrate from the first surface to the second surface in the light source area, the power line being formed adjacent to the light source area, wherein the first surface is located on an exterior top surface of the base substrate and the second surface is located on an exterior bottom surface of the base substrate; and a light source including:

a heat-dissipating plate disposed on the base substrate;

a heat-dissipating pin protruding from and continuously extending from the heat-dissipating plate and inserted into the combination hole, wherein a first end of the heat-dissipating pin opposite a leading end of the heat-dissipating pin continuously extends from the heat-dissipating plate, wherein the heat-dissipating pin extending from the heat dissipating plate forms a substantial L-shape, wherein the heat-dissipating plate on the base substrate is a first leg of the substantial L-shape, and the heat dissipating pin is a second leg of the substantial L-shape, the second leg of the substantial L-shape extending into the combination hole formed through the base substrate;

a heat-dissipating layer including a first portion disposed between the base substrate and the heat-dissipating plate forming the first leg, a second portion disposed on the exterior bottom surface of the base substrate adjacent to the combination hole, and a connecting portion extending into an inner surface of the combination hole in the base substrate, wherein the first portion contacts an exterior bottom surface of the heat-dissipating plate forming the first leg and wherein the connecting portion connects the first portion to the second portion and is disposed on a sidewall of the base substrate and in contact with the heat-dissipating pin forming the second leg;

a light emitting chip electrically connected to the power line;

a housing surrounding the light emitting chip, the housing having a receiving space spanning from a top surface to a bottom surface of the housing, wherein the heat-dissipating plate is disposed on the bottom surface of the housing, wherein the light emitting chip is disposed on the heat-dissipating plate exposed by the receiving space, and the light emitting chip makes contact to the heat-dissipating plate;

a first solder disposed on a corner edge of the heat-dissipating plate and on the first portion of the heat-dissipating layer to connect the corner edge of the heat-dissipating plate to the first portion of the heat-dissipating layer; and a second solder connecting an end portion of the heat-dissipating in to the connecting portion of the heat-dissipating layer in the hole of the base substrate and the second portion of the heat-dissipating layer.

12. The BLU of claim 11, wherein the light source further comprises the power-transmitting part including power input and power output parts fixed to the housing and respectively adjacent to both sides of the heat-dissipating plate along a second direction substantially perpendicular to the first direction, the power input part and the power output part extending beyond the housing to be electrically connected with power input and power output lines of the power line, respectively.

13. The BLU of claim 11, further comprising a heat-dissipating sheet disposed between the bottom plate and the second surface and contacting the second surface and the heat-dissipating layer.

14. The BLU of claim 11, wherein the heat-dissipating pin has a length shorter than a thickness of the base substrate.

* * * * *